United States Patent
Chen et al.

(10) Patent No.: US 12,092,405 B2
(45) Date of Patent: Sep. 17, 2024

(54) SMART COLD PLATE FOR REDUNDANT LIQUID COOLING LOOPS

(71) Applicant: Dell Products L.P., Round Rock, TX (US)

(72) Inventors: Yuan Chen, Shanghai (CN); Weidong Zuo, Shrewsbury, MA (US); Regan Zhu, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 187 days.

(21) Appl. No.: 17/541,961

(22) Filed: Dec. 3, 2021

(65) Prior Publication Data

US 2023/0175795 A1   Jun. 8, 2023

(51) Int. Cl.
*F28F 27/02* (2006.01)
*G05D 7/06* (2006.01)
*H05K 7/20* (2006.01)

(52) U.S. Cl.
CPC ........... *F28F 27/02* (2013.01); *G05D 7/0635* (2013.01); *H05K 7/20254* (2013.01); *H05K 7/20763* (2013.01)

(58) Field of Classification Search
CPC ... F28F 27/02; G05D 7/0635; H05K 7/20254; H05K 7/20763; H05K 7/20272; H05K 7/20281; H05K 7/20781; H05K 7/20654; H05K 7/20645
See application file for complete search history.

(56) References Cited

U.S. PATENT DOCUMENTS

| | | | |
|---|---|---|---|
| 11,839,064 B2 * | 12/2023 | Gao | H05K 7/20763 |
| 2009/0126910 A1 * | 5/2009 | Campbell | H05K 7/20781 |
| | | | 165/104.33 |
| 2010/0236772 A1 * | 9/2010 | Novotny | H05K 7/20836 |
| | | | 165/287 |
| 2011/0075373 A1 * | 3/2011 | Campbell | H05K 7/2079 |
| | | | 361/701 |
| 2011/0265983 A1 * | 11/2011 | Pedersen | F28F 27/02 |
| | | | 165/200 |
| 2014/0238065 A1 * | 8/2014 | Bonnin | H05K 7/20218 |
| | | | 62/259.2 |
| 2016/0242318 A1 * | 8/2016 | Krug, Jr. | H05K 7/20254 |
| 2020/0064010 A1 * | 2/2020 | Yoshikawa | G06F 1/206 |
| 2020/0292253 A1 * | 9/2020 | Chen | F28F 27/02 |
| 2022/0071063 A1 * | 3/2022 | Heydari | H05K 7/20836 |
| 2022/0240421 A1 * | 7/2022 | Zhang | H05K 7/20772 |
| 2023/0028610 A1 * | 1/2023 | Fish | F16K 11/0716 |

* cited by examiner

*Primary Examiner* — Travis Ruby
(74) *Attorney, Agent, or Firm* — Chamberlain, Hrdlicka, White, Williams & Aughtry; Aly Z. Dossa

(57) ABSTRACT

A device and systems for cooling hardware components is disclosed. The smart cold plate (CP) device includes a first inlet port for supplying a first coolant path, a second inlet port for supplying a second coolant path, and a valve for selectively controlling a flow of a coolant between the first and second inlet ports and an internal port, the internal port connecting the first and second inlet ports to a CP. The device also includes an external port connected to the CP for removing the coolant from the smart CP device and a connector through which power is supplied to the valve. Various cooling systems incorporating the smart CP device are disclosed.

7 Claims, 8 Drawing Sheets

SMART COLD PLATE FOR REDUNDANT LIQUID COOLING LOOPS

BACKGROUND

It is very common for information technology (IT) infrastructures to use a liquid, or a combination of liquid and air, to cool hardware components. To dissipate the heat generated, a liquid (e.g., water-based, coolant-based, and/or other liquids) is configured to move through a liquid path such that the liquid flows by heat-producing components, causing the heat to be dissipated. Cooling systems may also employ air flow for dissipating heat from components (e.g., fans operated to move air). Such air flow may be included in a path or applied directly to heat producing components.

SUMMARY

In general, in one aspect, embodiments disclosed herein are directed to a smart cold plate (CP) device that includes a first inlet port for supplying a first coolant path, a second inlet port for supplying a second coolant path, and a valve for selectively controlling a flow of a coolant between the first and second inlet ports and an internal port, the internal port connecting the first and second inlet ports to a CP. The device also includes an external port connected to the CP for removing the coolant from the smart CP device and a connector through which power is supplied to the valve.

In another aspect, embodiments disclosed herein are directed to a cooling system that includes one or more node plates. The node plates include at least one smart cold plate (CP) device. The system also includes at least one coolant distribution unit (CDU) for distributing coolant to each smart CP device and at least two coolant lines supplying coolant from the at least one CDU to each of the smart CP devices.

In another aspect, embodiments disclosed herein are directed to a cooling system that includes a first coolant path that includes a first radiator connected to a first pump and a second coolant path that includes a second radiator connected to a second pump. The first pump further connected to a first smart cold plate (CP) device, and the second pump further connected to a second smart CP device. The first coolant path is connected to a first inlet port of the first smart CP device, and the second coolant path is connected to a first inlet port of the second smart CP device. Also, a second inlet port of the first smart CP device is connected to the second radiator, and a second inlet port of the second smart CP device is connected to the first radiator.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1:
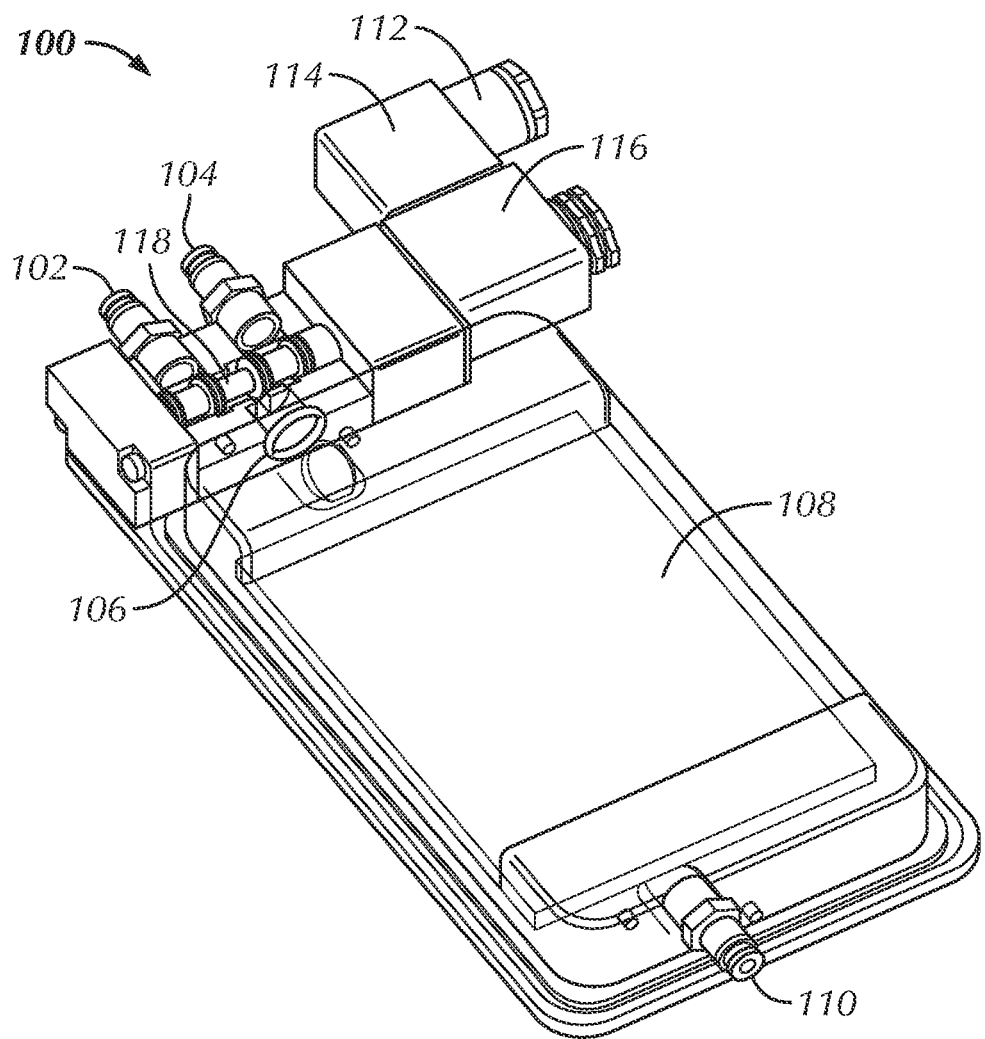
FIG. 1 shows a schematic of a smart cold plate (CP) in accordance with one or more embodiments disclosed herein.

Specific embodiments will now be described with reference to the accompanying figures.

In the below description, numerous details are set forth as examples of embodiments described herein. It will be understood by those skilled in the art, that have the benefit of this Detailed Description, that one or more embodiments described herein may be practiced without these specific details and that numerous variations or modifications may be possible without departing from the scope of the embodiments described herein. Certain details known to those of ordinary skill in the art may be omitted to avoid obscuring the description.

In the below description of the figures, any component described with regard to a figure, in various embodiments described herein, may be equivalent to one or more like-named components described with regard to any other figure. For brevity, descriptions of these components may not be repeated with regard to each figure. Thus, each and every embodiment of the components of each figure is incorporated by reference and assumed to be optionally present within every other figure having one or more like-named components.

Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

Liquid cooling solutions for storage/server products are known to improve performance and power density. Such systems have a risk of coolant leakage, which can lead to system shutdowns. In mainstream deployments, only one liquid loop is realized. With only one open loop, in the event of a failure or service in the infrastructure, the entire system may have to be shut down. For example, in the event of leakage in a single cold plate (CP) or tubing, healthy nodes may be forced to shut down until the leakage is resolved.

In general, embodiments disclosed herein are directed to a cooling system with an integrated, smart CP that enables redundant liquid loops. In accordance with embodiments disclosed herein, systems may provide continuous cooling capacity in the event of a single liquid loop failure. Embodiments provide the ability to isolate nodes in the event of a failure, or service, in the cooling system, such as in the valve, the node, and/or the Coolant Distribution Unit (CDU). At the same time, embodiments may maintain 100% cooling capacity for all other healthy nodes.

Embodiments disclosed herein may be adapted to open or closed loop cooling solutions. For example, embodiments may be used in an open loop Liquid-to-Liquid (L-L) system that engages with the water of a datacenter facility. Embodiments may also be used in a Liquid-to-Air (L-A) cooling system deployed in a rack. Embodiments include a unique CP design that can adapt to Open Loop L-L/L-A cooling systems and, thus, potentially avoid shutdowns. More specifically, embodiments provide the ability to switch off a failed loop and use a healthy loop to keep some, or all, the nodes in the rack alive. Embodiments also provide the ability to isolate nodes for service or in the event of a failure.

Embodiments may also be used in a closed loop Liquid Assisted Air Cooling (LAAC) system. Such systems may be entirely located inside a node. For example, as described in FIG. 7, embodiments provide the ability to keep a node alive by sharing a healthy radiator and shutting off a loop to a leaking radiator.

FIG. 1 shows a schematic of a smart CP (100) in accordance with one or more embodiments disclosed herein. The smart cold plate (100) includes a first inlet port (102), a second inlet port (104), an internal port (106), a CP (108), and an external port (110). The smart CP further includes a connector (112), a Power Control Board (PCB) (114), a solenoid (116), and a spool (118). The connector (112), PCB (114), solenoid (116) and spool (118) may be fixed on the smart CP (100) using screws and positioned by contacting the CP (108) base.

In embodiments disclosed herein, the connector (112) accommodates a power supply line and at least one signal line. The PCB (114) may include an amplifier (not shown) to change the supply current, or voltage, exerted on the solenoid (116). The supply current is used to change the position of the spool (118). As such, the position of the spool (118) may be adjusted to control the flow through the first (102) and second (104) inlet ports in accordance with embodiments disclosed herein. As described further with respect to FIG. 2, by controlling the position of the spool (118), the smart CP (100) is capable of connecting and disconnecting different cooling loops to facilitate cooling of the CP (108).

In one or more embodiments, the PCB (114) may send and receive digital or analog signals associated with the operation of the smart CP (100) through the connector (112). For example, the PCB (114) may send and receive current and/or voltage values associated with the operation of an amplifier in the PCB. Embodiments may also include an external controller (not shown) for management of the smart cold plate (100). Such a controller may be located inside a node of the cooling system or external to the cooling system (e.g., a different rack, or in a central control room). Such a controller may also be located in a Coolant Distribution Unit (CDU). A CDU includes the necessary hardware and components for circulating and monitoring the coolant (e.g., pumps, reservoir, chillers, sensors, etc.). In one or more embodiments, the cooling system may detect errors and/or failures associated with the coolant loops and/or during monitoring of the smart CP (100), resulting in input signals to PCB (114) by a controller.

In embodiments disclosed herein, the smart CP (100), the PCB (114), solenoid (116), and spool (118) may function to provide a 4-position 3-way/port directional solenoid valve. In accordance with embodiments disclosed herein, the coolant pressure may be typically less than ~4 psi, with a flow rate of ~2 L/min. As such, a valve occupying a quarter of the smart CP volume provides sufficient cooling in accordance with embodiments disclosed herein.

The smart CP (100) includes a first inlet port (102) and a second inlet port (104). In embodiments, the coolant may flow through any combination of the first inlet port (102) and the second inlet port (104), as demonstrated in FIG. 2. The coolant flows from one, or both, of the inlet ports (102, 104) through the value to the internal port (106). The internal port (106) is connected to the CP (108) cooling chamber. The coolant proceeds through the CP (108) cooling chamber and exits the smart CP (100) by the external port (110).

Figure 2:
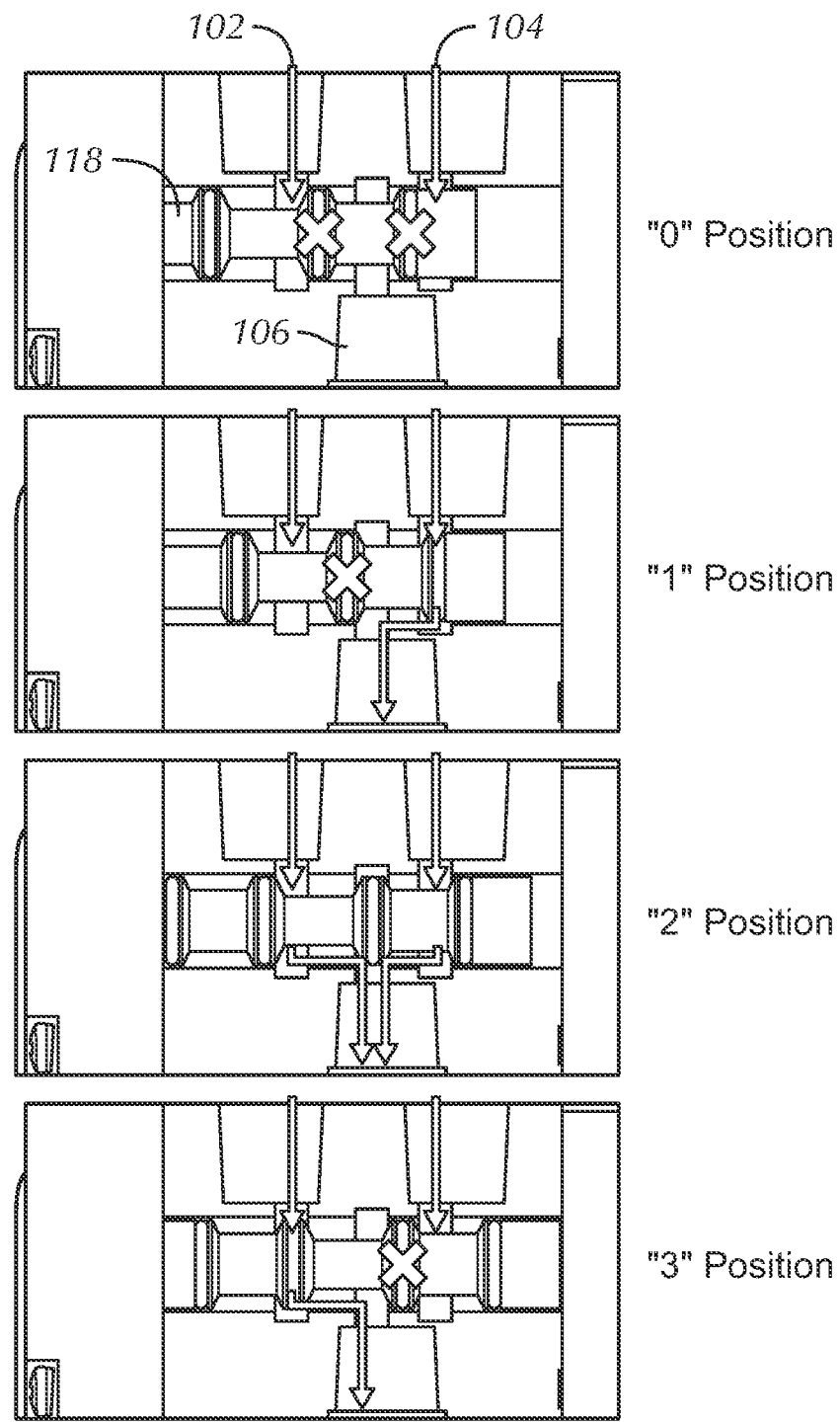
FIG. 2 shows solenoid valve positions in accordance with one or more embodiments disclosed herein.

FIG. 2 shows solenoid valve positions in accordance with one or more embodiments disclosed herein. As described above, by controlling the position of the spool (118), the smart CP (100) is capable of connecting and disconnecting different cooling loops. FIG. 2 demonstrates the various spool positions that control the flow through the valve. For example, the "0" position blocks the flow from both the first inlet (102) and second inlet (104) from flowing through the internal port (106); the "1" position blocks flow from the first inlet (102) and allows flow from the second inlet (104); the "2" position allows flow through both the first inlet (102) and second inlet (104); and the "3" position blocks flow through the second inlet (104) and allows flow from the first inlet (102).

In embodiments disclosed herein the spool (118) moves to an appropriate position according to the signals received by the PCB (114). The spool (118) may be moved according to a status or mode of operation of the smart CP (100). For example, the spool may be normally kept in the "2" position, resulting in two cooling loops jointly connected to the smart CP. This allows for two redundancy designs: one where each loop is responsible for approximately 50% of the cooling, or one loop is responsible for 100% of the cooling and the second loop is idle.

In accordance with embodiments disclosed herein, the spool in the "1" or "3" position allows a healthy loop to flow through the smart CP and a failed loop to be shut off In such embodiments, the flowing loop may be responsible for 100% of the cooling performance. Such a loop would likely provide at least 50% of a previous cooling performance that included two loops. Such loops may still provide up to 100% cooling with certain hardware components, depending on the component's usage, air flow, ambient temperatures, etc.

In accordance with embodiments disclosed herein, the spool in the "0" position cuts off all loops to the smart CP. The loops may be cut off due to detected errors in accordance with embodiments disclosed herein. For example, the loops may be cut off due to an I/O interface error, an inability to send/receive signals, a supply voltage falls below a minimum value, and/or unacceptable deviation of a current/voltage value received from a controller.

Figure 3:
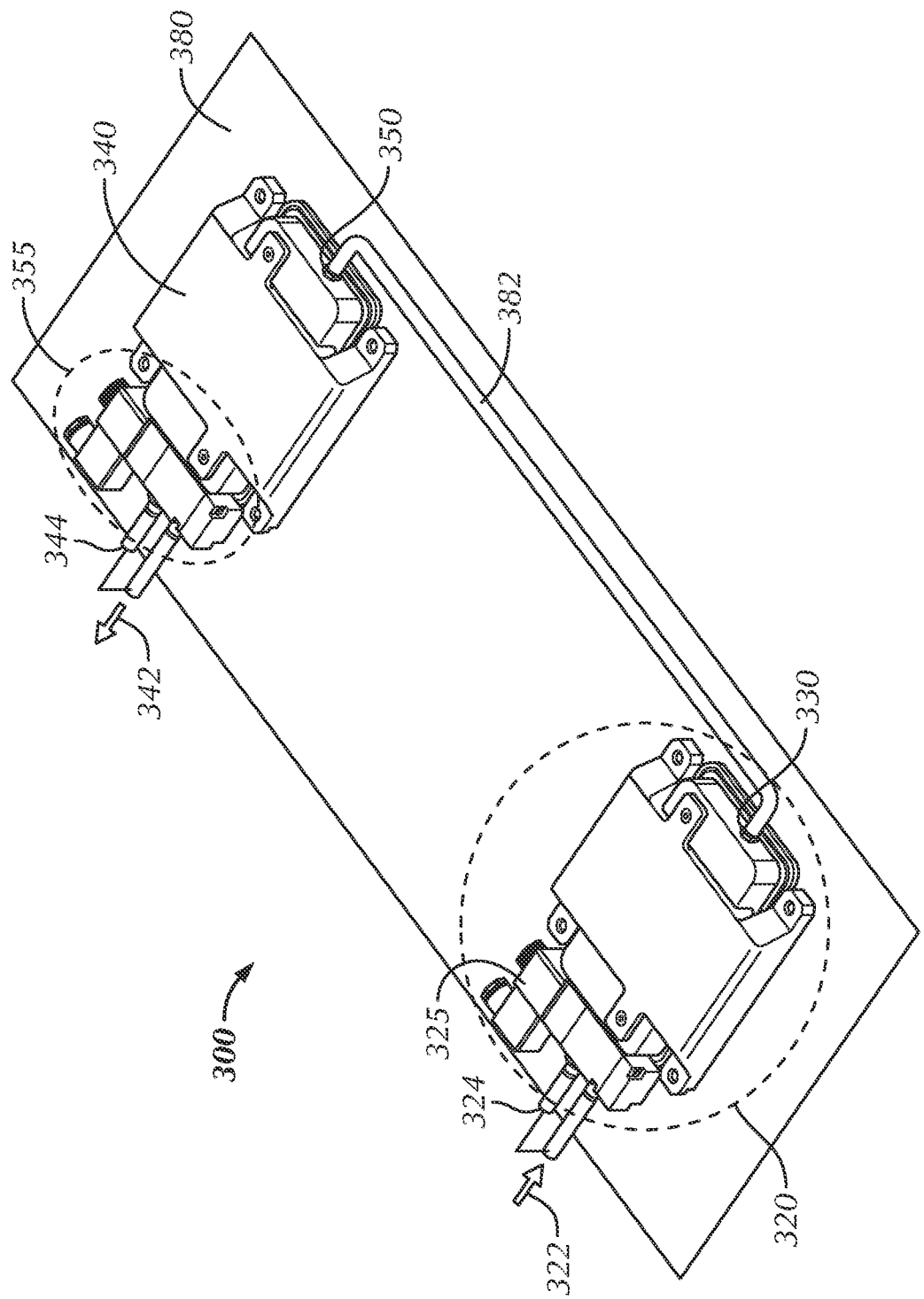
FIG. 3 shows a schematic of a 2 CPU socket in accordance with one or more embodiments disclosed herein.

FIG. 3 shows a schematic of a 2 CPU socket in accordance with one or more embodiments disclosed herein. In embodiments associated with FIG. 3, a first smart CP (320) is connected to a second smart CP (340) such that coolant exits the external port (330) of the first smart CP (320), travels through conduit (382), and enters an external port (350) of the second smart CP (340). The first smart CP (320), conduit (382), and second smart CP (340) are mounted on a motherboard (380). Hardware components (not shown), such as processors or CPUs, may be disposed between each of the first smart CP (320) and second smart CP (340) and the motherboard (380) in accordance with embodiments disclosed herein.

In FIG. 3, the pair of valve (325) controlled inlets (322, 324) of the first smart CP (320) is connected to the valve (355) controlled inlets (342, 344) of the second smart CP (340). Thus, two redundant coolant loops may be used to cool a 2 CPU socket in accordance with one or more embodiments disclosed herein.

Figure 4A:
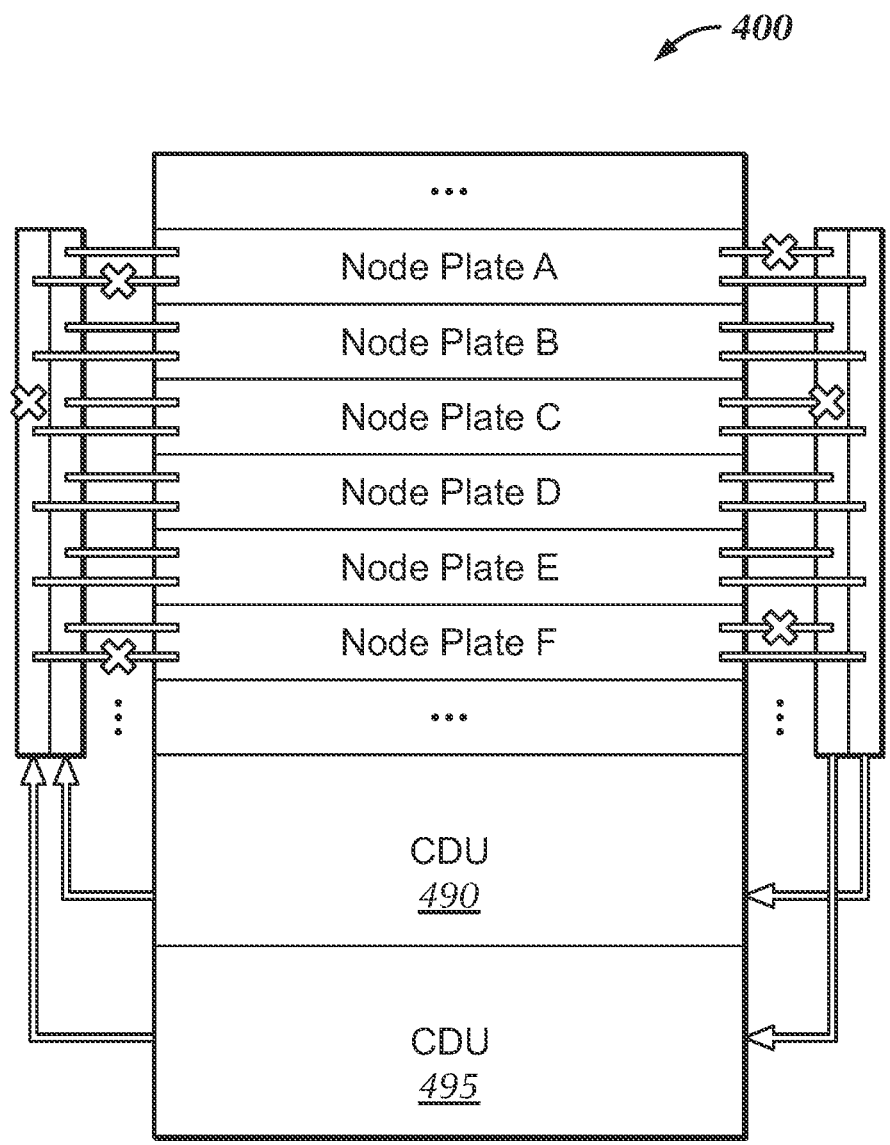
FIGS. 4A and 4B demonstrate an example in accordance with one or more embodiments disclosed herein.
Figure 4B:
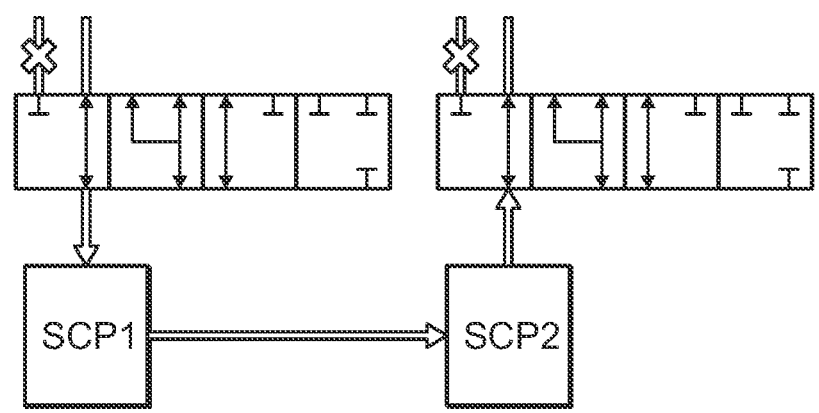

FIGS. 4A and 4B demonstrate an example in accordance with one or more embodiments disclosed herein. FIG. 4A demonstrates a system (400) in accordance with one or more embodiments disclosed herein. The system (400) may include multiple node plates (A . . . F). In some embodiments, each node plate (A . . . F) may include the 2 CPU socket described in FIG. 3. However, one of ordinary skill in the art will appreciate embodiments disclosed herein are not limited solely to the 2 CPU socket of FIG. 3. For example, a node plate (A . . . F) may include any even number of smart CPs.

Further, the number of node plates in the system (400) is also not particularly limited. One of ordinary skill in the art will appreciate that the number of node plates per cooling loop may be determined based on desired conditions, as well as ambient temperatures, workload of the node plates, coolant flow variables, etc.

The system (400) of FIG. 4A also includes a first CDU (490) and a second CDU (495). In FIG. 4A, the first CDU (490) is responsible for coolant flowing through a first loop, while the second CDU (495) is responsible for coolant flow through a second loop. FIG. 4B demonstrates different valve settings (respectively) for a first smart CP (SCP1) and a second smart CP (SCP2) for the one or more the node plates (A . . . F).

In the examples of FIGS. 4A and 4B, the valve positions of the first smart CP (SCP1) and the second smart CP (SCP2) allow for the first CDU (490) to be responsible for 100% of the cooling. The second CDU (495) may be kept in an idle mode until needed in accordance with embodiments disclosed herein. Alternatively, the second CDU (495) may be in need of service or in a state of failure. In other words, the second CDU may not be operating. The valve settings demonstrated in FIGS. 4A and 4B may maintain cooling of the node plates (A . . . F) while a second CDU is being serviced.

Figure 5:
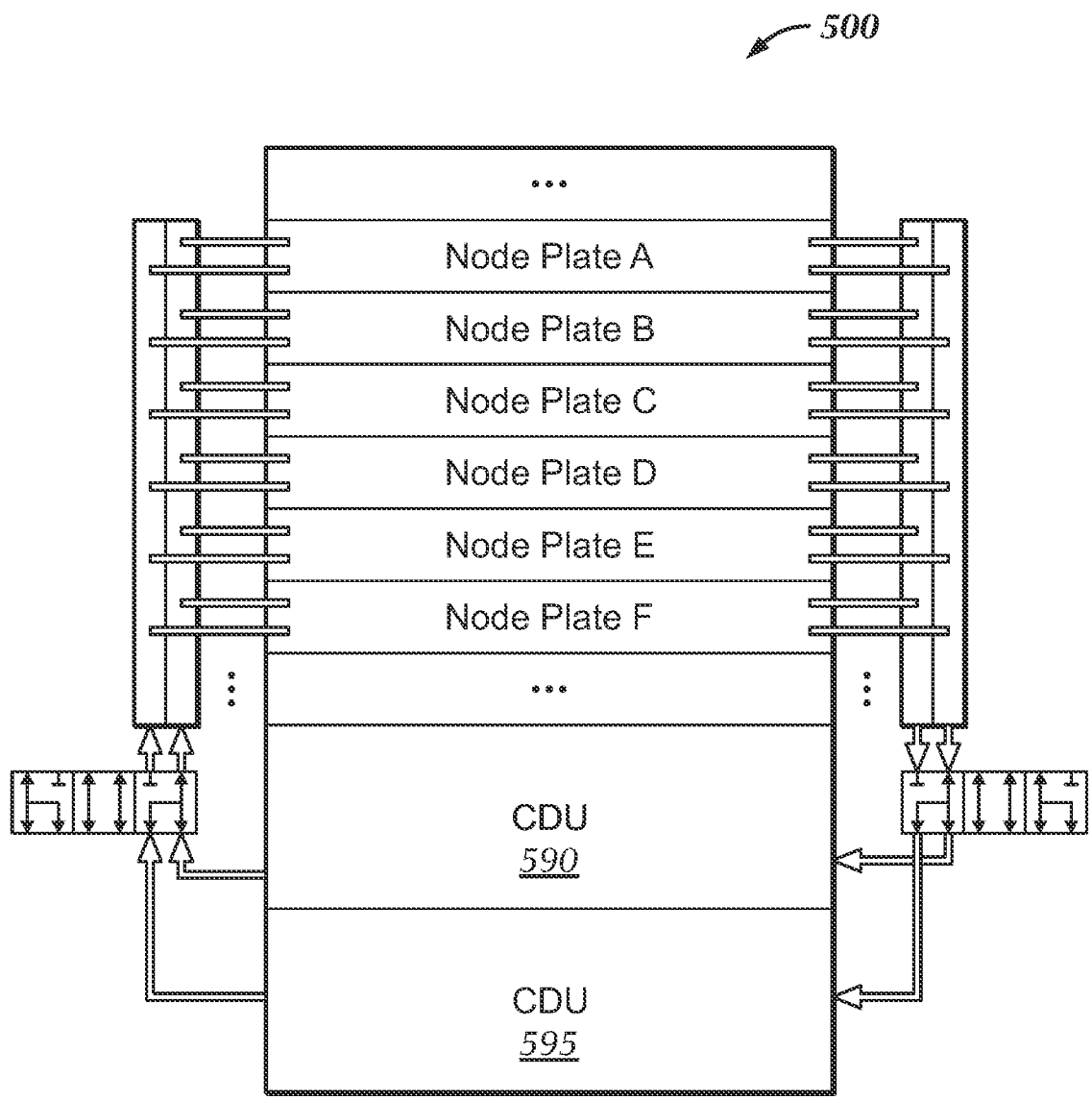
FIG. 5 demonstrates another example in accordance with one or more embodiments disclosed herein.

FIG. 5 demonstrates another example in accordance with one or more embodiments disclosed herein. Similar to FIG. 4A, FIG. 5 also includes a first CDU (590) and a second CDU (595). In FIG. 5, the valve positions are demonstrated such that each CDU provides a maximum of 50% of the cooling. In the embodiments of FIG. 5, both the first CDU (590) and second CDU (595) operate continuously to cool the node plates (A . . . F). In the valve settings demonstrated in FIG. 5, one of the CDUs may still be moved to an idle state or turned off for service; however, the remaining CDU would be responsible for all the cooling, which could result in an overall 50% reduction in cooling for any service/idle time.

Figure 6:
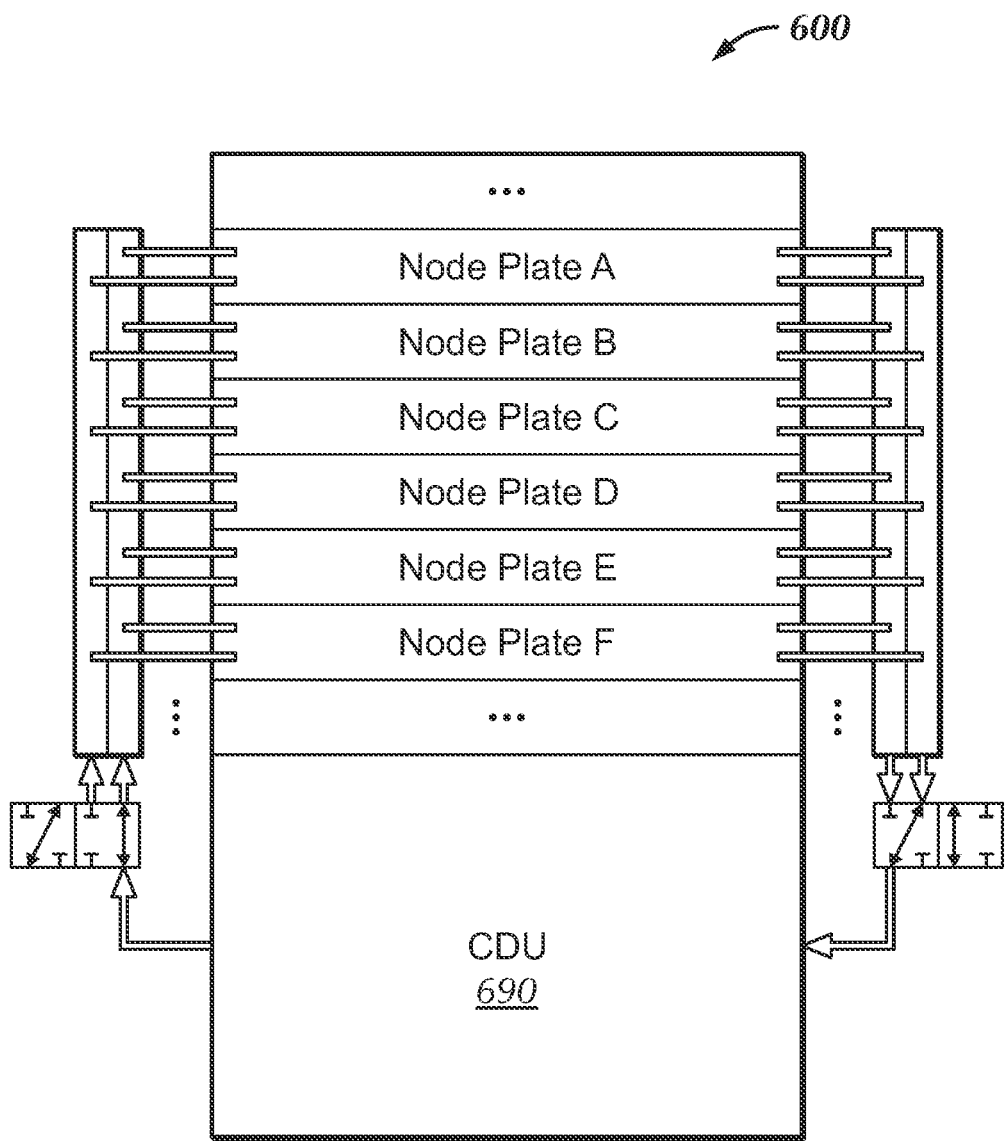
FIG. 6 demonstrates an example system with a single Coolant Distribution Unit (CDU) in accordance with one or more embodiments disclosed herein.

FIG. 6 demonstrates an example system with a single CDU in accordance with one or more embodiments disclosed herein. In the system (600) of FIG. 6, a single CDU (690) is responsible for the flow through all the node plates (A . . . F). The valve settings shown in FIG. 6 may be configured to select which loop of the redundant loops provides the cooling. One of ordinary skill in the art will appreciate that the number of CDUs may be selected based on the number of node plates. Other factors, such as ambient conditions and workload of the node plates may also influence such a selection in accordance with embodiments disclosed herein.

The liquid (or air) cooling systems described in FIGS. 4-6 may be used to isolate one or more of the node plates for service or repair, while maintaining the cooling on other node plates in accordance with one or more embodiments disclosed herein. One of ordinary skill in the art will appreciate that further valves may be incorporated into the examples of FIGS. 4-6, which may add further versatility for manipulating coolant flow.

Figure 7:
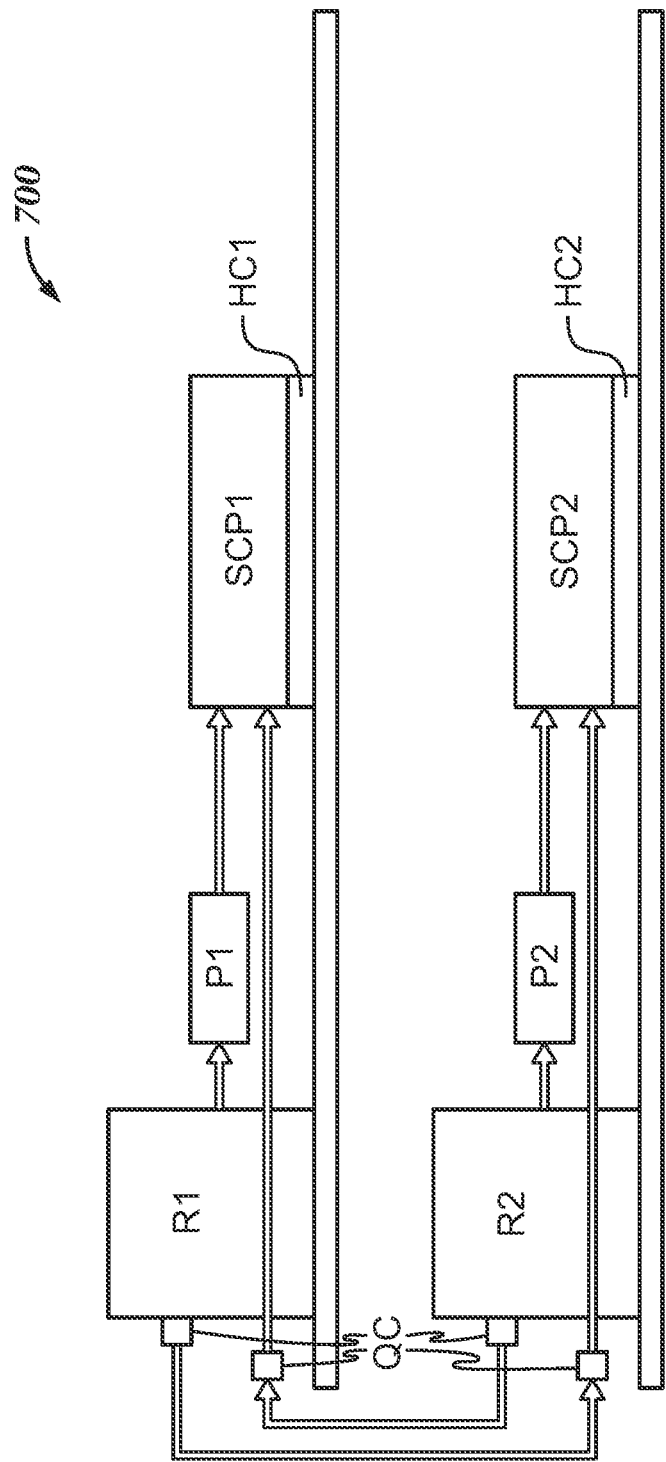
FIG. 7 demonstrates an example of a closed system in accordance with one or more embodiments disclosed herein.

FIG. 7 demonstrates an example of a closed system in accordance with one or more embodiments disclosed herein. The system (700) includes a first radiator (R1), a first pump (P1), a first smart CP (SCP1), and a first hardware component (HC1). The system (700) also includes a second radiator (R2), a second pump (P2), a second smart CP (SCP2), and a second hardware component (HC2). The first and second radiators may be Liquid Assisted Air Cooling (LAAC) type radiators. The first and second hardware components may be, for example, a processor or CPU.

In the system of FIG. 7, the first radiator (R1) and first pump (P1) are connected to one inlet of the first smart CP (SCP1). The other inlet of the first smart CP (SCP1) is connected to a pass through the first radiator (R1) to the second radiator (R2). The second radiator (R2) and second pump (P2) are connected to one inlet of the second smart CP (SCP2). The other inlet of the second smart CP (SCP2) is connected to a pass through the second radiator (R2) to the first radiator (R1). The first radiator (R1) and second radiator (R2) may be connected using quick connections (QC). In the examples of FIG. 7, if a radiator leak is detected, the smart CPs may open a link to another radiator. For example, if the first radiator (R1) leaks, the first smart CP (SCP1) may close the link from the pump and open the link to the second radiator (R2). In this situation, the second radiator (R2) would be responsible for cooling both hardware components (HC1, HC2). The embodiments of FIG. 7 may be used to isolate a radiator or pump for repair or service.

Embodiments disclosed herein provide a smart CP that may be used to control redundant cooling loops in network environments. Embodiments presented herein may provide continuous cooling capacity in the event of a loop failure. Embodiments may also provide the ability to isolate nodes in the event of a failure, or service. At the same time, embodiments may maintain cooling capacity for all other healthy nodes in open and closed systems.

The advantages discussed above throughout the detailed description should be understood as being examples associated with one or more problems being solved by embodiments of the invention. However, one or more embodiments of the invention disclosed herein should not be limited to solving the same/similar problems. The disclosed invention is broadly applicable to address a range of problems beyond those discussed herein.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A cooling system comprising:
   one or more node plates, wherein each node plate comprises at least one smart cold plate (CP) device;
   at least one coolant distribution unit (CDU) for distributing coolant to each smart CP device; and
   at least two coolant lines supplying coolant from the at least one CDU to each of the smart CP devices,
   wherein each smart CP device comprises:
   a first inlet port for supplying a first coolant path from one of the at least two coolant lines;

a second inlet port for supplying a second coolant path from another of the at least two coolant lines;

a valve for selectively controlling a flow of a coolant between the first and second inlet ports and an internal port, the internal port connecting the first and second inlet ports to a CP, wherein each valve comprises:
  a power control board (PCB) comprising an amplifier;
  a solenoid; and
  a spool,
  wherein the power supplied through the connector causes the PCB to activate the solenoid to control a position of the spool, and
  wherein the valve is a 4-position directional solenoid valve;

an external port connected to the CP for removing the coolant from the smart CP, and a connector through which power is supplied to the valve.

2. The system of claim 1, wherein the position of the spool allows for coolant to flow through the valve from neither, one, or both of the first and second inlets.

3. The system of claim 1, wherein:
  each node plate comprises a first smart CP device and a second smart CP device.

4. The system of claim 1, further comprising:
  a first CDU and a second CDU, wherein the first CDU is connected to the first inlet of each smart CP device and the second CDU is connected to the second inlet of each smart CP device, and wherein the at least one CDU comprises the first CDU and the second CDU.

5. The system of claim 4, wherein the first CDU is not operating.

6. The system of claim 1, wherein the connector accommodates a power supply line and at least one signal line.

7. The system of claim 1, wherein the PCB sends and receives current values associated with the amplifier via a signal line.

\* \* \* \* \*